[19] United States Patent
Kim et al.

[11] Patent Number: 5,982,835
[45] Date of Patent: Nov. 9, 1999

[54] DIGITAL PROCESSING PHASE LOCK LOOP FOR SYNCHRONOUS DIGITAL MICRO-WAVE APPARATUS

[75] Inventors: Yong-Hoe Kim; Sug-Geun Kang, both of Seongnam, Rep. of Korea

[73] Assignee: SamSung Electronics Co., Ltd., Kyungki-do, Rep. of Korea

[21] Appl. No.: 08/789,233

[22] Filed: Feb. 4, 1997

[51] Int. Cl.[6] ............................... H03D 3/24; H03L 7/06; H03L 7/00
[52] U.S. Cl. .......................... 375/376; 327/156; 327/159; 331/25
[58] Field of Search ..................................... 375/376, 327; 331/25, 17, 14, 1 A, 1 R; 327/156, 159, 155, 150, 147

[56] References Cited

U.S. PATENT DOCUMENTS

| | | | |
|---|---|---|---|
| 4,418,318 | 11/1983 | Swagerty et al. | 375/376 |
| 4,752,748 | 6/1988 | Grzeszykowski | 331/1 A |
| 4,972,160 | 11/1990 | Sylvain | 331/1 A |
| 5,475,325 | 12/1995 | Nezu | 327/147 |
| 5,673,004 | 9/1997 | Park | 375/376 |
| 5,717,402 | 2/1998 | Chu | 331/158 |
| 5,726,607 | 3/1998 | Brede et al. | 331/17 |

*Primary Examiner*—Stephen Chin
*Assistant Examiner*—Betsy L. Deppe
*Attorney, Agent, or Firm*—Robert E. Bushnell, Esq.

[57] ABSTRACT

A digital processing phase lock loop for use in a synchronous micro-wave transmitter includes: a reference clock receiving unit for receiving an electric signal or an optical signal of 8 KHz as an reference clock from an external signal input unit or a switching unit; a phase comparator for comparing the reference clock output from the reference clock receiving unit with a self-clock feedback depending on a counter clock of 19.44 MHz and then producing phase detection information of 8 bits; a phase control unit for performing a phase control according to the period of phase control corresponding to a predetermined mode, including at least one of superhigh speed mode, a high speed mode and a low speed mode with inputting the phase detection information and for performing a looppass filtering for jitter suppression, thereby outputting data of 16 bits; a signal converter for converting the data of 16 bits into an analog signal; a VCO(Voltage Controlled Oscillator) for operating by inputting the analog signal according to its instantaneous frequency; and a frequency divider for dividing output frequency of the VCO and then feeding back the divided output frequency, thereby outputting a self-clock of 8 KHz to the phase comparator.

18 Claims, 3 Drawing Sheets

FIG. 1 *(Prior Art)*

DIGITAL PROCESSING PHASE LOCK LOOP FOR SYNCHRONOUS DIGITAL MICRO-WAVE APPARATUS

FIELD OF THE INVENTION

The present invention relates generally to a synchronous micro-wave transmitter and, more particularly, to a digital processing phase lock loop for embodying a synchronous timing and at this time developing phase synchronous speed upon contact with another communication network. The present invention can be widely used as a digital processing phase lock loop for synchronous digital micro-wave apparatus.

SUMMARY OF THE INVENTION

It is an object of the present invention to provide a digital processing phase lock loop for stably performing construction of an initial network synchronizer by diversifying a period of phase control.

It is another object of the present invention to provide a digital processing phase lock loop for a phase alignment upon a timing mode and a reference switching mode.

To achieve these and other objects of the present invention, there is provided a digital processing phase lock loop for use in a synchronous microwave transmitter, including: a reference clock receiving unit for receiving an electric signal or an optical signal of 8 KHz as reference clock from an external signal input unit or a switching unit; a phase comparator for comparing the reference clock output from the reference clock receiving unit with a self-clock feedback depending on a counter clock of 19.44 MHz and then producing phase detection information of 8 bits; a phase control unit for performing a phase control according to the period of phase control corresponding to a predetermined mode, including at least one of a superhigh speed mode, a high speed mode and a low speed mode with inputting the phase detection information and for performing a looppass filtering for jitter suppression, thereby outputting data of 16 bits; a signal converter for converting the data of 16 bits into an analog signal; a VCO (Voltage Controlled Oscillator) for operating by inputting the analog signal according to its instantaneous frequency; and a frequency divider for dividing an output frequency of the VCO and then feeding back the divided output frequency, thereby outputting a self-clock signal of 8 Khz to the phase comparator.

DETAILED DESCRIPTION OF THE PREFERRED EMBODIMENT(S)

The present invention relates generally to a synchronous micro-wave transmitter and, more particularly, to a digital processing phase lock loop for embodying a synchronous timing and at this time developing phase synchronous speed upon contact with another communication network.

Figure 1:
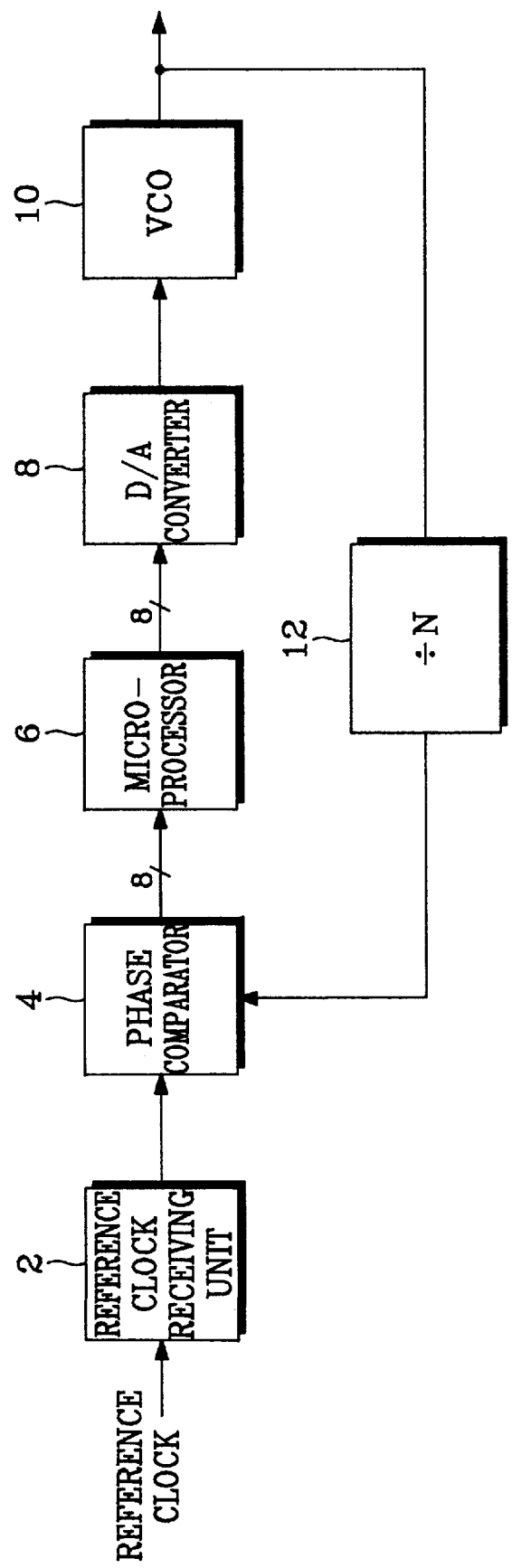
FIG. 1 is a block diagram illustrating a prior art digital processing phase lock loop for a synchronous micro-wave transmitter.

In general, as illustrated in FIG. 1, a digital processing phase lock loop using of a synchronous micro-wave transmitter is comprised of a reference clock receiving unit 2, a phase comparator 4, a micro-processor 6 for performing a phase control, a D/A(Digital to Analog) converter 8, a VCO( Voltage controlled Oscillator) 10, and a frequency divider 12. If a reference clock such as an electric signal or an optical signal of 8 KHz is applied to the reference clock receiving unit 2 from an external signal input unit or a switching unit of the above digital processing phase lock loop, the reference clock receiving unit 2 applies the reference clock to the phase comparator 4 after receiving it. The phase comparator 4 phase-compares the reference clock with a clock signal fedback at an output terminal and then divided by N at the frequency divider 12, thereby detecting a phase difference therebetween and outputting the detected value to the micro-processor 6. At this time, the outputted data is set to 8 bits, typically. The micro-processor 6 performs a phase control for the phase lock and a looppass filtering for jitter suppress, and then outputs it to the D/A converter 8. For example, 80C51 chip can be used as the micro-processor 6. The D/A converter 8 converts a digital signal outputted from the micro-processor 6 into an analog signal, and then applies it to the VCO 10. The VCO 10 operates by inputting the analog signal according to an instantaneous frequency thereof. The phase lock is performed by the operation of the VCO 10. Here, if the phase lock is not completed, the output of the VCO 10 is continuously fedback via the frequency divider 12, thereby completing the phase lock in the long run. The signal where the phase lock is completed is applied to a processor unit of the transmitter through a processor contact unit.

As stated above, the prior art completes the phase lock by using the micro-processor. However, since the prior art has late response speed, typically it takes 8 seconds, it takes over 30 minutes to form a path in the digital micro-wave transmitter comprised of a master and a slave construction. In addition, the prior art has a disadvantage in that the remaining block elements except for the phase comparator 4 are installed outside as separate circuits, thereby requiring a large width of board within the digital processing phase lock loop.

Hereinafter, a preferred embodiment of the present invention will be discussed in detail with reference to the accompanying drawings.

It should be noted that like reference numerals are used for like elements though they may be displayed in a separate drawing. Further, in the following description, numerous specific details such as particular components for the specific circuits are set forth to provide a more thorough understanding of the present invention. It will be apparent, however, to one skilled in the art that the present invention can be practiced without these specific details. Furthermore, the detailed description of known functions and construction details unnecessarily obscuring the subject matter of the present invention is avoided in the following description. Still furthermore, it will be possible to change to the following specific words according to the intention of inventor or practice thereof since it is defined by considering of its function according to the present invention, and accordingly, it will be understood that the definition should be specified by entire contents of the present invention.

Figure 2:
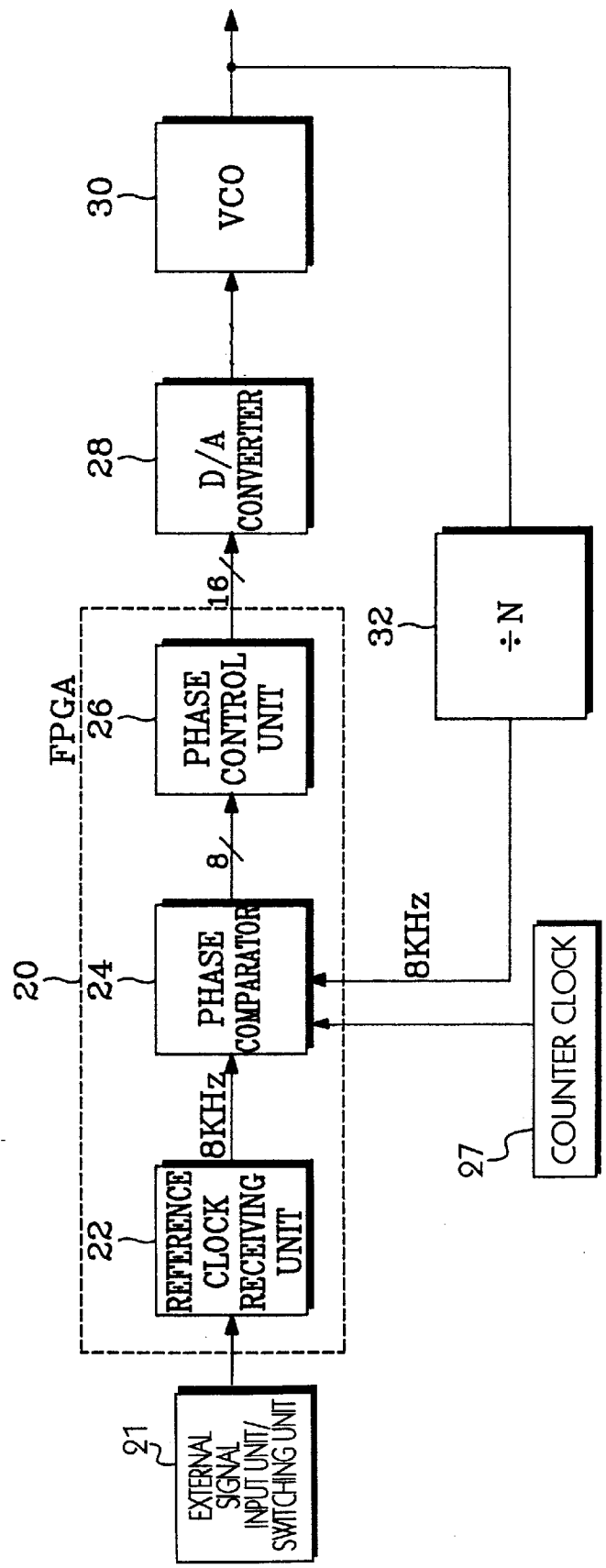
FIG. 2 is a block diagram illustrating a digital processing phase lock loop for a synchronous micro-wave transmitter according to the present invention.

FIG. 2 is a block diagram illustrating a digital processing phase lock loop for a synchronous micro-wave transmitter according to the present invention. Referring to FIG. 2, the present invention is designed by using a FPGA(Field and Programmed Gate Array) comprised of a reference clock receiving unit 22, a phase comparator 24 and a phase control unit 26.

At the master exchange, the reference clock receiving unit 22 according to the present invention includes an E1 contact unit for contacting with dots of 2EA, and an E1 forming unit having an E1 framer. Also, there is an circuit unit to enable contact with an clock, such as with an external input unit/switching unit 21, from which is extracted an optical and electric signal having 155M(Megaton) transmitted from a NE(Network Element). Additionally, the slave exchange contacts the clock extracted from the electric signal having 155M(Megaton) received from the central station. At this time, a reference clock outputted from the reference clock receiving unit 22 is set to 8 KHz. If the electric or optical signal having 8 KHz as a reference clock is applied to the reference clock receiving unit 22, the reference clock receiving unit 22 applies the received signal to the phase comparator 24 after receiving it.

Figure 3:
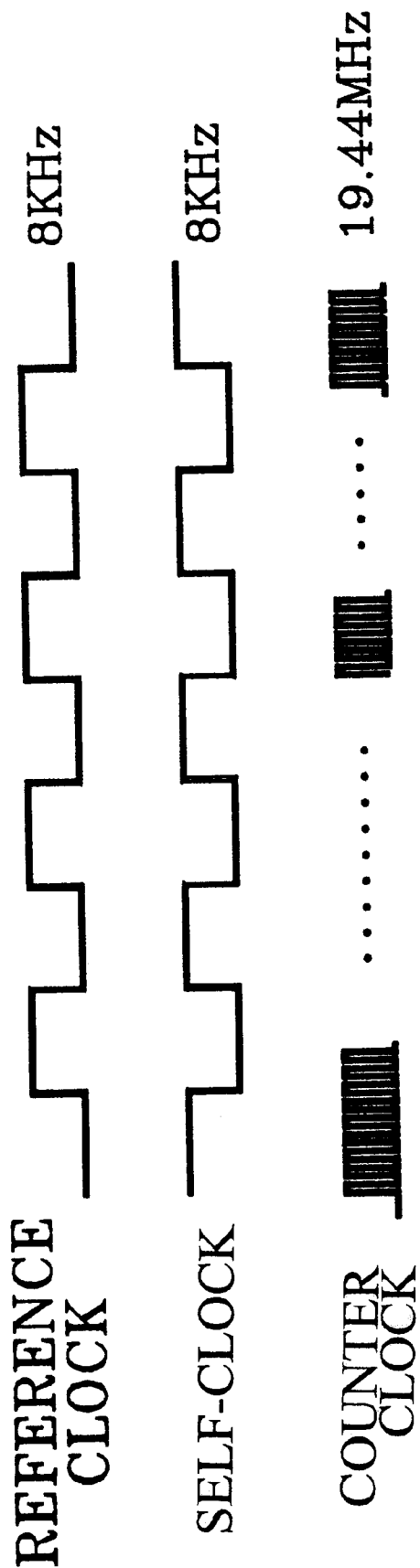
FIG. 3 is a waveform illustrating signals inputted to a phase comparator according to the present invention.

As illustrated in FIGS. 2 and 3, the phase comparator 24 according to the present invention compares a reference clock of 8 KHz from reference clock receiving unit 22 with a self-clock fedback through a frequency divider 32 dependent upon input the phase comparator 24 received from the counter clock 27 of 19.44 MHz for counting a period of a reference clock 8 KHz, as illustrated in FIG. 3, for example, (i.e. the period is 51.47 ns), and produces the phase detection information of 8 bits. Then, the phase detection information is applied to the phase control unit 26.

The phase control unit 26 performs phase control for phase lock and looppass filtering for jitter suppress and then, outputs it to a D/A converter 28. For example, the design specification of the phase control unit 26 according to the present invention can be a FPGA(IC 10) having 10,000 gate level and a word size of 8 bit, for example. Further, the period of the phase control unit is a 1 msec mode to a 8 sec mode.

The phase control unit 26 performs phase control according to a predetermined period of phase control corresponding to a predetermined mode for phase control, the predetermined mode of phase control including at least one of a superhigh speed mode, a high speed mode, and a low speed mode. The 1 msec mode is used at a superhigh speed and the 10 msec at a high speed. In addition, the low speed mode of a 1 sec mode to the 8 sec mode can determine the period of the phase control according to the state of the network synchronizer. Especially, during the 8 sec mode there is performed the hibernation feature, thereby not generating phase transition. Thus, the 8 sec mode is used upon suppression of the jitter. For that reason, at a micro-wave switching unit an allowable phase difference can be fluently compensated upon errorless switching. Herein, the 8 sec mode is therefore called a "lock mode". The period of the phase control as stated in the above description develops the phase lock speed, so that the network synchronizer of the micro-wave transmitter can be maintained stably and rapidly.

Therefore, data of 16 bits, one of a word size of 8 bits as an upper 8 bits and another of a word size 8 bits as a lower 8 bits, is outputted from the phase control unit 26 to a D/A converter 28. The D/A converter 28 converts a digital signal outputted from the phase control unit 26 into an analog signal and then applies it to a VCO 30. The VCO 30 inputs from the D/A converter 28 an analog signal, and VCO 30 operates according to the analog signal's instantaneous frequency as received by the VCO 30. The phase lock is completed by the operation of the VCO 30. Here, if the phase lock is not completed, the output of the VCO 30 is continuously fedback via the frequency divider 32, thereby completing the phase lock in the long run. The signal completing the phase lock is applied to a processor unit of the transmitter through a processor contact unit.

The D/A converting bit of the D/A converter 28 according to the present invention is determined as 16 bits. Further, the VCO 30 according to the present invention has a central frequency of 155.520 MHz and the scope of frequency control is set to ±1555.2 Hz. Also, minimum frequency control scope is set to $3.05 \times 10^{-10}$ Hz.

As described in the above, the present invention develops the phase lock speed by diversifying the period of the phase control and using the FPGA. Thus, the present invention provides an advantage in that the initial network synchronization can be stably constructed at the synchronous micro-wave apparatus.

While the present invention has been described with reference to specific embodiments, the description is illustrative of the invention and is not to be constructed as limiting the invention. Various modifications may occur to those skilled in the art without departing from the true spirit and scope of the invention as defined by the appended claims.

We claim:

1. A digital processing phase lock loop for use in a synchronous micro-wave transmitter, comprising:
   a reference clock receiving unit for receiving one of an electric signal and an optical signal of 8 KHz as a reference clock from one of an external signal input unit and a switching unit;
   a phase comparator for comparing said reference clock output from said reference clock receiving unit with a self-clock feedback for producing phase detection information of 8 bits dependent upon input to said phase comparator from a counter clock of 19.44 MHz;
   a phase control unit for performing a phase control according to a predetermined period corresponding to a predetermined mode for phase control, said predetermined mode for phase control including at least one of a superhigh speed mode, a high speed mode and a low speed mode, said phase control unit for receiving said phase detection information for performing said phase control and for performing a looppass filtering for jitter suppression, and for thereby outputting data of 16 bits for said phase control;
   a signal converter for converting said data of 16 bits output from said phase control unit into an analog signal;
   a VCO (Voltage Controlled Oscillator) for receiving said analog signal from said signal converter, said VCO for operating according to an instantaneous frequency of said analog signal; and
   a frequency divider for dividing an output frequency of said VCO and for feeding back said divided output frequency to said phase comparator, said frequency divider to thereby to thereby output the self-clock signal of 8 KHz for feedback to said phase comparator.

2. The digital processing phase lock loop as claimed in claim 1, wherein said reference clock receiving unit, said phase comparator and said phase control unit comprise a Field and Programmed Gate Array (FGPA).

3. The digital processing phase lock loop as claimed in claim 1, wherein said phase control unit determines said predetermined period of phase control as 1 millisecond on superhigh speed for said superhigh speed mode, 10 milliseconds on high speed for said high speed mode, and 1 second to 8 seconds for said low speed mode.

4. The digital processing phase lock loop as claimed in claim 3, wherein said reference clock receiving unit, said phase comparator and said phase control unit comprises a Field and Programmed Gate Array (FGPA).

5. The digital processing phase lock loop as claimed in claim 1, wherein said VCO has a central frequency of 155.520 MHz and a scope of frequency control for said VCO is set to at least one of +1555.2 Hz and −1555.2 Hz.

6. The digital processing phase lock loop as claimed in claim 1, wherein a minimum frequency control scope for said VCO is set to $3.05 \times 10^{-10}$ Hz.

7. The digital processing phase lock loop as claimed in claim 6, wherein said phase control unit determines said predetermined period of phase control as 1 millisecond on superhigh speed for said superhigh speed mode, 10 milliseconds on high speed for said high speed mode, and 1 second to 8 seconds for said low speed mode.

8. The digital processing phase lock loop as claimed in claim 7, wherein said reference clock receiving unit, said phase comparator and said phase control unit comprise a Field and Programmed Gate Array (FGPA).

9. The digital processing phase lock loop as claimed in claim 1, wherein said predetermined period of phase control develops a phase lock speed.

10. A digital processing phase lock loop for use in a synchronous micro-wave transmitter, comprising:

a reference clock receiving unit for receiving one of an electric signal and an optical signal of a first frequency as a reference clock;

a phase comparator for comparing said reference clock output from said reference clock receiving unit with a self-clock feedback for producing phase detection information dependent upon input to said phase comparator from a counter clock of a second frequency;

a phase control unit for performing a phase control according to a predetermined period of phase control corresponding to a predetermined mode for phase control, said predetermined mode for phase control including at least one of a superhigh speed mode, a high speed mode and a low speed mode, said phase control unit for receiving said phase detection information for performing said phase control and for performing a looppass filtering for jitter suppression, and for thereby outputting data for said phase control;

a signal converter for converting said data output from said phase control unit into an analog signal;

a VCO (Voltage Controlled Oscillator) for receiving said analog signal from said signal converter, said VCO for operating according to an instantaneous frequency of said analog signal; and a frequency divider for dividing an output frequency of said VCO and for feeding back said divided output frequency to said phase comparator, said frequency divider to thereby output the self-clock signal of said first frequency for feedback to said phase comparator.

11. The digital processing phase lock loop as claimed an claim 10, wherein said reference clock receiving unit, said phase comparator and said phase control unit comprise a Field and Programmed Gate Array (FGPA).

12. The digital processing phase lock loop as claimed in claim 10, wherein said phase control unit determines said predetermined period of phase control as 1 millisecond on superhigh speed for said superhigh speed mode, 10 milliseconds on high speed for said high speed mode, and 1 second to 8 seconds for said low speed mode.

13. The digital processing phase lock loop as claimed in claim 10, wherein said predetermined period of phase control develops a phase lock speed.

14. The digital processing phase lock loop as claimed in claim 10, wherein said reference clock receiving unit, said phase comparator and said phase control unit comprise a Field and Programmed Gate Array (FGPA), and wherein said phase control unit determines said predetermined period of phase control as 1 millisecond on superhigh speed for said superhigh speed mode, 10 milliseconds on high speed for said high speed mode, and 1 second to 8 seconds for said low speed mode.

15. The digital processing phase lock loop as claimed in claim 14, wherein said VCO has a central frequency of 155.520 MHz and a scope of frequency control for said VCO is set to at least one of +1555.2 Hz and −1555.2 Hz.

16. The digital processing phase lock loop as claimed in claim 14, wherein a minimum frequency control scope for said VCO is set to $3.05 \times 10^{-10}$ Hz.

17. The digital processing phase lock loop as claimed in claim 15, wherein said predetermined period of the phase control develops a phase lock speed.

18. The digital processing phase lock loop as claimed in claim 10, wherein a minimum frequency control scope for said VCO is set to $3.05 \times 10^{-10}$ Hz.

* * * * *